(12) United States Patent
Gatta et al.

(10) Patent No.: US 8,725,097 B2
(45) Date of Patent: May 13, 2014

(54) AMPLIFIER FOR CABLE AND TERRESTRIAL APPLICATIONS WITH INDEPENDENT STAGE FREQUENCY TILT

(75) Inventors: Francesco Gatta, Laguna Niguel, CA (US); Giuseppe Cusmai, Irvine, CA (US); Ramon A. Gomez, San Juan Capistrano, CA (US); Leonard Dauphinee, Irvine, CA (US); Bryan Juo-Jung Hung, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 571 days.

(21) Appl. No.: 12/847,857

(22) Filed: Jul. 30, 2010

(65) Prior Publication Data

US 2011/0193625 A1 Aug. 11, 2011

Related U.S. Application Data

(63) Continuation-in-part of application No. 12/770,233, filed on Apr. 29, 2010, and a continuation-in-part of application No. 12/847,888, filed on Jul. 30, 2010, now Pat. No. 8,035,445.

(60) Provisional application No. 61/302,798, filed on Feb. 9, 2010, provisional application No. 61/302,809, filed on Feb. 9, 2010, provisional application No. 61/308,545, filed on Feb. 26, 2010.

(51) Int. Cl.
| | | |
|---|---|---|
| H04B 1/18 | (2006.01) | |
| H04B 1/06 | (2006.01) | |
| H04B 7/00 | (2006.01) | |

(52) U.S. Cl.
USPC ................................ 455/188.2; 455/234.2

(58) Field of Classification Search
USPC ........... 455/3.02, 3.03, 3.04, 132, 140, 188.1, 455/188.2, 199.1, 234.1, 234.2; 348/707, 348/725, 731
See application file for complete search history.

(56) References Cited

U.S. PATENT DOCUMENTS

| | | | |
|---|---|---|---|
| 3,978,422 A * | 8/1976 | Rheinfelder | ................. 330/132 |
| 4,355,420 A | 10/1982 | Ishihara | |
| 5,214,505 A * | 5/1993 | Rabowsky et al. | ............. 725/77 |
| 5,608,803 A | 3/1997 | Magotra et al. | |
| 5,793,253 A | 8/1998 | Kumar et al. | |
| 6,400,935 B1 | 6/2002 | Williams | |
| 7,142,060 B1 * | 11/2006 | Maeda | ........................ 330/295 |
| 7,336,125 B2 | 2/2008 | Kyu et al. | |
| 7,352,239 B2 | 4/2008 | Lee et al. | |
| 7,369,827 B1 * | 5/2008 | Koch et al. | ................ 455/191.1 |
| 7,508,268 B2 | 3/2009 | Sasaki et al. | |
| 7,675,381 B2 | 3/2010 | Lin | |
| 7,804,356 B2 | 9/2010 | Gomez et al. | |
| 8,035,445 B2 | 10/2011 | Gomez et al. | |
| 2003/0063758 A1 | 4/2003 | Poletti | |
| 2005/0195335 A1* | 9/2005 | Gomez et al. | ................. 348/707 |
| 2005/0237107 A1 | 10/2005 | Onody | |

(Continued)

*Primary Examiner* — Nguyen Vo
(74) *Attorney, Agent, or Firm* — Sterne, Kessler, Goldstein & Fox P.L.L.C.

(57) ABSTRACT

A system comprises a first amplifier stage including a first amplifier, a second amplifier stage including second and third amplifiers, and a fourth amplifier. The first amplifier stage includes an input and an output. The second amplifier stage is coupled between the output of the first amplifier stage and a first output node. The fourth amplifier is coupled between the input of the first amplifier stage and a second output node.

20 Claims, 12 Drawing Sheets

(56) References Cited

U.S. PATENT DOCUMENTS

| | | | |
|---|---|---|---|
| 2005/0265084 A1* | 12/2005 | Choi | 365/189.04 |
| 2006/0128328 A1* | 6/2006 | Shah | 455/178.1 |
| 2007/0082637 A1* | 4/2007 | Nam | 455/189.1 |
| 2007/0096941 A1 | 5/2007 | Morys | |
| 2008/0248765 A1 | 10/2008 | Gater | |
| 2009/0176467 A1* | 7/2009 | Im et al. | 455/182.1 |
| 2009/0219449 A1* | 9/2009 | Van Sinderen et al. | 348/731 |
| 2009/0273401 A1* | 11/2009 | Fanous et al. | 330/254 |
| 2010/0045875 A1* | 2/2010 | Pugel | 348/731 |
| 2010/0265407 A1* | 10/2010 | Kyranas et al. | 348/707 |
| 2011/0194623 A1 | 8/2011 | Chih et al. | |

\* cited by examiner

AMPLIFIER FOR CABLE AND TERRESTRIAL APPLICATIONS WITH INDEPENDENT STAGE FREQUENCY TILT

CROSS REFERENCE TO RELATED APPLICATIONS

This application claims priority under 35 U.S.C. §119(e) to U.S. Provisional Patent Applications Ser. Nos. 61/302,798, filed Feb. 9, 2010, 61/302,809, filed Feb. 9, 2010 and 61/308, 545, filed Feb. 26, 2010, which are all incorporated by reference herein in their entireties. This application is a continuation-in-part of U.S. application Ser. No. 12/770,233, filed Apr 29, 2010, which is incorporated by reference herein in its entirety. This application is related to U.S. application Ser. No. 12/847,888, filed Jul. 30, 2010, now issued as U.S. Pat. No. 8,035,445, issued on Oct. 11, 2011, which is incorporated by reference herein in its entirety.

FIELD OF THE INVENTION

The present invention generally relates to amplifier systems, and more particularly to amplifier systems including cascaded amplifier stages, each amplifier stage having frequency dependent tilt amplifiers.

BRIEF DESCRIPTION OF THE DRAWINGS/FIGURES

The accompanying drawings, which are incorporated herein and faun part of the specification, illustrate the present invention and, together with the description, further serve to explain the principles of the invention and to enable a person skilled in the relevant art(s) to make and use the invention.

Figure 1:
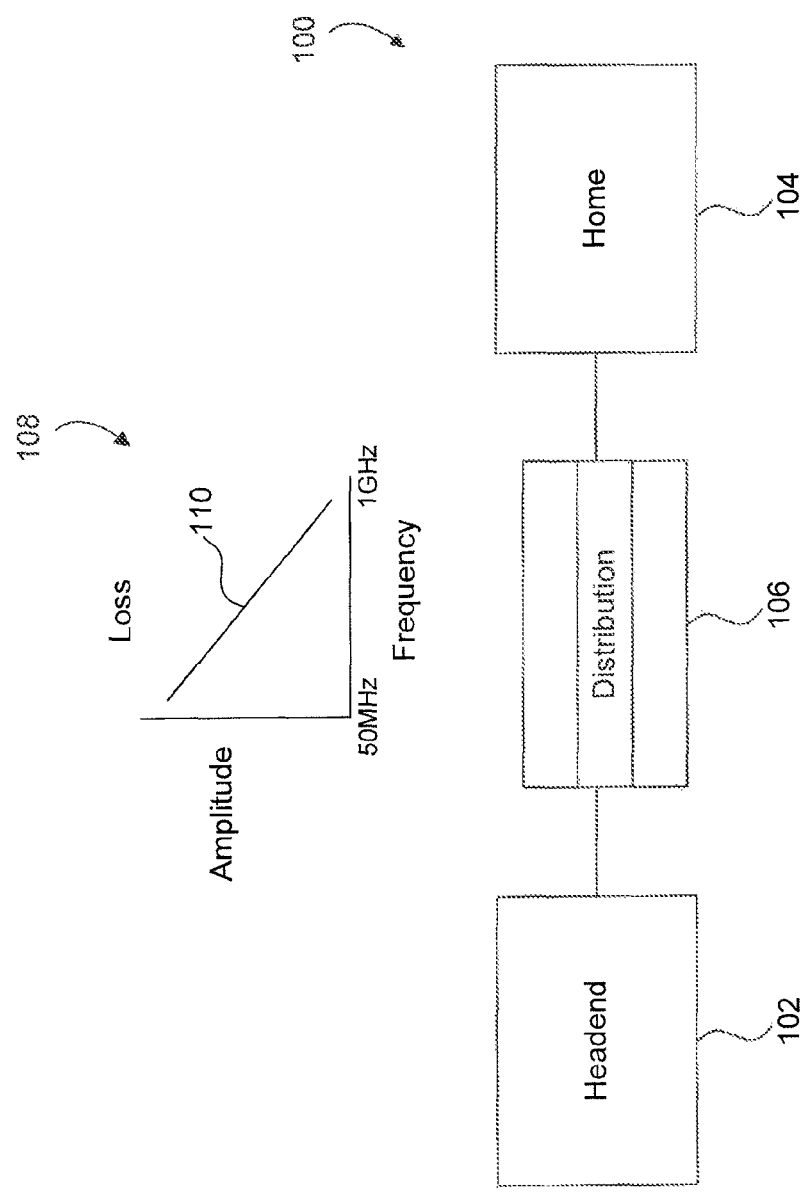
FIG. 1 shows a system, according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Radio Frequency (RF) amplifiers, including broadband RF amplifiers, are typically designed to have flat gain, noise figure (NF), and linearity over their operating frequency range, as much as practically possible. However, in many applications (e.g., cable television (CATV)), the input signal may not have equal power and density across the entire operating frequency range. Also, broadband multi-channel systems, e.g., cable television (CATV) or terrestrial television, are often transmitted over media (e.g., air, cables, or fibers) with non-flat frequency response. As a result, signal power of individual channels may vary widely across an allocated band, even if the transmitted levels are the same. The power difference over frequency can greatly increase the dynamic range requirement for broadband receivers. As an example, CATV systems can suffer from roll-off at high frequencies. This effect is known as tilt or frequency tilt. With the extension of CATV upper frequency range from 860 MHz to 1 GHz by many operators (to deliver more data services), the amount of tilt seen by CATV users may increase significantly.

When the input signal is amplified by a flat gain amplifier, weaker power components of the resulting amplified signal will have poorer signal-to-noise ratio (SNR) and signal-to-distortion ratio (SDR) than prior to amplification. Further, this degradation in SNR and SDR will continue in subsequent signal processing stages of the overall system.

In some cases, the tilt results in attenuation of the signal so that the power at the receiver is below a threshold amount. In this situation, the tilt is usually compensated for by increasing the power at the transmission and/or receiving end across all channels. However, not all channels may need the increased power. For example, lower frequency signals may need no power increase, such that increasing their power causes too high a power at the receiver.

Therefore, what is needed is a system and method allowing for frequency dependent tilt compensation.

An embodiment of the present invention provides a system comprising a first amplifier stage including a first amplifier, a second amplifier stage including second and third amplifiers, and a fourth amplifier. The first amplifier stage has an input and an output. The second amplifier stage is coupled between the output of the first amplifier stage and a first output node. The fourth amplifier is coupled between the input of the first amplifier stage and a second output node.

Another embodiment of the present invention provides a method comprising the following steps (not necessarily in the order shown). Splitting an input signal into substantially identical first and second signals. Loop-though amplifying the first signal to produce a first output signal. Variable gain-tilt amplifying the second signal to produce a third signal. Splitting the third signal into substantially identical fourth and fifth signals. Variable gain-tilt amplifying the fourth signal to produce a second output signal. Variable gain-tilt amplifying the fifth signal to produce a third output signal.

A further embodiment of the present invention provides an amplifier system comprising a first amplifier stage configured to tilt a signal based on frequency, a second amplifier stage coupled between the first amplifier stage and a first output, and configured to tilt a signal based on frequency, and a loop-through fixed-gain amplifier coupled between the first amplifier stage and a second output.

A still further embodiment of the present invention provides a system comprising first and second signal receiving portions, a tuner, and a switch. The first signal receiving portion includes a terrestrial signal antenna and a first amplifier system. The second signal receiving portion includes a cable signal receiver and a second amplifier system. The switch is coupled to the tuner and the first and second amplifier systems.

Further features and advantages of the embodiments, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

FIG. 1 shows a system 100. For example, system 100 can be a television signal system transmitting cable TV (CATV) signals and/or terrestrial TV signals. System 100 includes a first end 102, e.g., a transmission end, a second end 104, e.g., a receiving end, and a transmission medium 106 coupled therebetween.

In one example, first end 102 can be a headend or a television signal distribution location and second end 104 can be a home or user location. Transmission medium 106 can be a distribution device including, for example, a wired device (e.g., coaxial or fiber optic cables) or a wireless device (e.g., antenna, satellite or cellular). A plurality of signals having different frequencies can be transmitted over distribution device 106 substantially simultaneously as either analog, digital, or both analog and digital signals. The signals may represent a plurality of channels corresponding to the plurality of frequencies. For example, 50 MHz to 1 GHz signals can be transmitted over distribution device 106.

In one example, graph 108 represents an exemplary Power versus Frequency signal loss curve 110. The power loss can be based on attenuation of the signal as it travels over distribution device 106. As can be seen in this example, high frequency signals can exhibit larger power loss during transmission than lower frequency signals. As discussed above, there is a minimum threshold power that should be received at home or user location 104 for the signal to be effective. For example, a home system can have front-end noise. A high frequency signal with a below threshold power may not be effective after interacting with the front-end noise due to distortion. In one example, a tilt or slope of curve 110 can be measured to determine if the value of the frequency band will result in meeting the threshold.

In one example, an amplifying system 112, e.g., a LNA distribution chip, can be located at second end 104. Amplifying system 112 can change the tilt of the signal before forwarding the signal to downstream devices. Changing the tilt of the signal is discussed in more detail below. Herein, signal "tilt" means the gain or loss of the signal over frequency, e.g., a slope of the signal.

Figure 2:
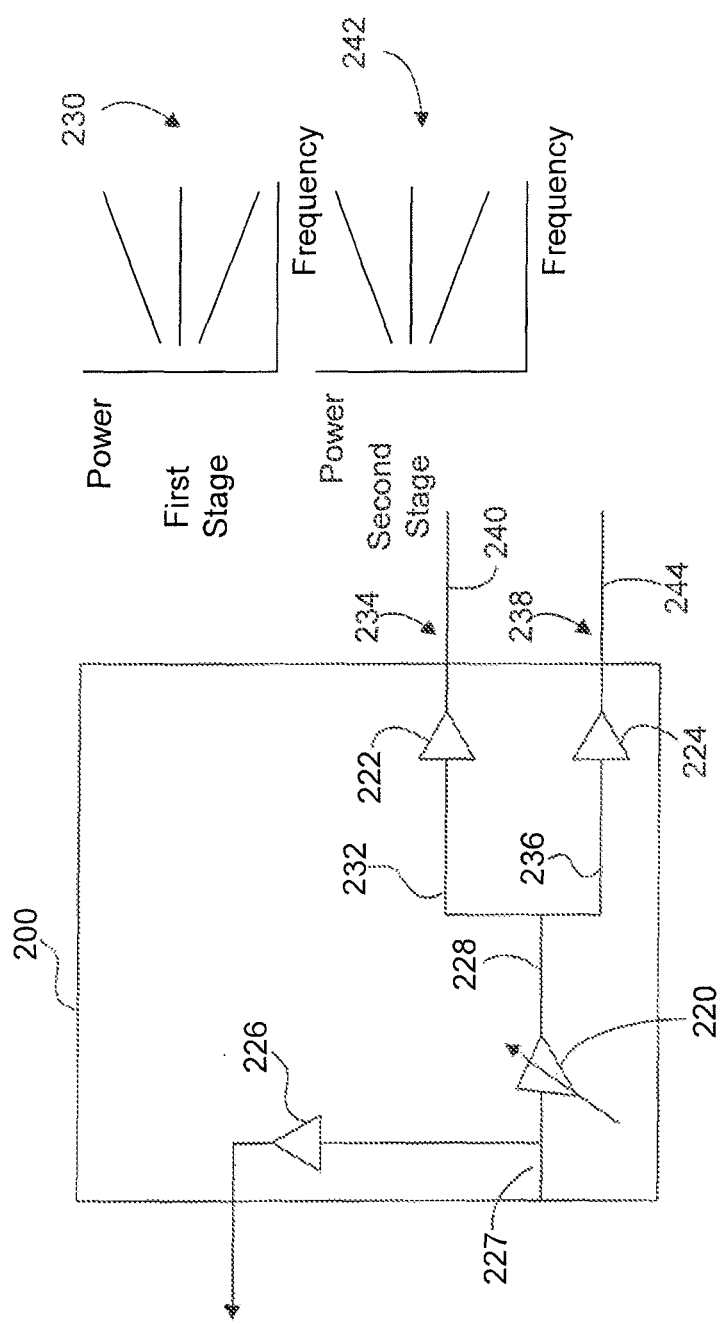
FIG. 2 shows a single input, multiple output amplifier system, according to an embodiment of the present invention.

FIG. 2 shows a single input, multiple output amplifier system 200, according to an embodiment of the present invention. For example, system 200 can be implemented as amplifying system 112 in receiving end 104 of system 100 in FIG. 1. In one example, system 200 includes a first amplifier 220, a second amplifier 222, a third amplifier 224, and a fourth amplifier 226. In one example, first amplifier 220 can be considered a first stage amplifier, second and third amplifiers 222 and 224 can be considered second stage amplifiers, and fourth amplifier 226 can be considered a loop through (LT) amplifier. In this configuration, the first and second stage can be considered cascaded. It is to be appreciated more or fewer amplifiers may be found in each amplifier stage or in the LT portion of system 200, based on a desired application.

In one example, first amplifier 220 can be a configurable, adjustable or programmable amplifier. For example, first amplifier 220 can be a gain-tilt amplifier (also known as a tilt amplifier or a frequency tilt amplifier, used interchangeably herein) having a programmable tilt compensation. In one example, a gain-tilt amplifier inverts the frequency response seen by a high frequency signal over the transmission medium 106. In this example, an input signal 227 can be tilted to generate a signal 228 exhibiting a power to frequency curve as shown in graph 230. For example, signal 228 may have a 0 dB (e.g., flat frequency response), +/−5 dB (e.g., tilted frequency response, where + can be tilt up an − can be tilt down), or +/−10 dB (e.g., tilted frequency response), etc. frequency tilt. Thus, amplifier 220 can either increase, decrease, or maintain a tilt of signal 227 when producing signal 228. In one example, positive tilt compensation can mean that the high frequency portion of the signal will be increased relative to the low frequency portion of the signal. Similarly, negative tilt compensation can beam that thee low frequency portion of the signal will be decreased relative to the high frequency portion of the signal.

In the example shown, signal 228 can be split to produce two substantially equivalent signals 232 and 236. In one example, splitting of signal 228 can be performed through use of a splitting circuit (not shown), while in another example splitting of signal 228 can be done using a wire with a splitting configuration. Signal 232 can travel along path 234 and signal 236 can travel along path 238. In this example, signal 232 can be received by amplifier 222 and signal 236 can be receive by amplifier 224.

Similarly to the function of amplifier 220, second and third amplifiers 222 and 224 can also be implemented as configurable, adjustable, or programmable gain-tilt amplifiers that exhibit a flat or tilted response. For example, a 0 dB, +/−5 dB, or +/−10 dB, etc., tilt can be generated with amplifier 222 and/or amplifier 224. In this example, second amplifier 222 can amplify signal 232 to produce a signal 240 that travels along path 234, and exhibits characteristics of power-frequency curve 230. A tilt or amplitude of signal 232 can be increased, decreased, or maintained by amplifier 222 to produce signal 240. Also, similarly, in this example third amplifier 224 can amplify signal 236 to produce a signal 244 that travels along path 238, and exhibits characteristic of curve 242. For example, a tilt or amplitude of signal 236 can be increased, decreased, or maintained by amplifier 224 to produce signal 244.

In one example, first amplifier 220, second amplifier 222, and third amplifier 224 can function as full spectrum in, full spectrum out amplifiers, such that the only processing of the signal is to correct for any frequency tilt.

Figure 5:
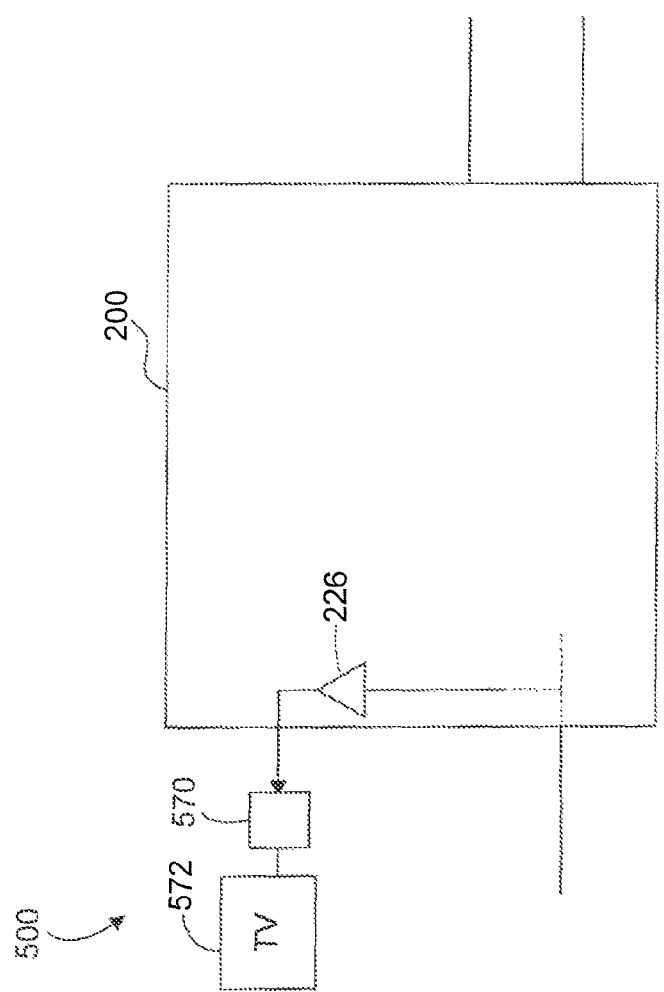
FIG. 5 shows an analog TV arrangement coupled to the system of FIG. 2, according to an embodiment of the present invention.

In one example, fourth amplifier 226 can be a loop through (LT) amplifier in a loop through (LT) path. In one example, fourth amplifier 226 is a fixed gain amplifier. In one example, LT amplifier 226 can be used to drive set-top boxes that do not have automatic gain control or TV sets. In another example, LT amplifier 226 can have fixed gain, low noise figure and high linearity to substantially eliminate degradation of the TV sets or set-top box that it is driving. Low and fixed gain substantially eliminates TV overload. In another example, LT amplifier 226 can have many modes, low noise figure or high linearity, and its dynamic range can be optimized for the different terrestrial or cable conditions. An exemplary implementation utilizing the LT path is shown in FIG. 5, discussed below.

In one example, amplifiers 220, 222, 224, and 226 can be amplifiers that exhibit a low noise figure with high linearity, e.g., low noise amplifiers (LNAs).

In one example, amplifiers 220, 222, and 224 can have automatic gain control (AGC) paths. For example, AGC can be accomplished through the embodiment shown in FIG. 4. Having automatic gain control paths can assure that subsequent downstream devices along paths 228, 234 and 238 will receive a signal having constant input power.

In one example, amplifier 220 is configurable to have either low noise figure and low linearity or normal noise figure and linearity. For example, terrestrial systems emphasize noise figure, while CATV systems emphasize linearity.

In one example, the second stage gain is controlled using a device (not shown) determining an optimal gain based on system wide information gathered regarding signals being processed throughout system 100 and/or system 200 or downstream devices.

In one example, through use of first and second cascaded amplifier stages, implementation of a gain profile exhibiting a stable and desired amount of tilt can more easily be produced. When only one amplifier stage is used, aggressive tilt gain may be required in order to obtain a final desired tilt compensation profile. However, when too much tilt gain compensation is performed, e.g., a large gain at high frequency, undesirable oscillations can occur on an output signal. Also, using a single stage can make it more difficult to obtain a desired power gain without experiencing instability. Thus, using a two cascaded stage amplifier system can allow for more optimal or desired power gain characteristics on the signal.

In one example, the first amplifier stage can perform an initial, and possibly larger, frequency tilt. In one example, the first amplification may be directed to voltage gain. In this example, the second amplifier stage can be used to perform a second, targeted, and possibly smaller frequency tilt. In one example, the second amplification can be directed to current gain. For example, using this cascaded amplification scheme, a coarse adjustment of frequency tilt modification can be followed by a fine adjustment.

In another example, through using first and second stages, a greater variety of tilt profiles can be implemented as compared to using a single amplifier stage.

In one example, each amplification stage, and each amplification, can utilize automatic gain control to implement a minimum noise figure for low amplitude input signals that require large amplification.

In one example, the first amplifier stage can result in a frequency tilt of 5 db and the second amplifier stage can result in an additional frequency tilt of 5 db. If this amount of gain tilt compensation were to be attempted with a single stage, a downstream tuner may not be able to operate properly because optimal tuner performance could be degraded. The degradation can occur because when using a single stage amplifier, the large amount of high-frequency gain due to the tilt profile will tend to cause overload. If this single-stage amplifier has automatic gain control, overload may be avoided but the gain control circuit will operate to reduce the amplifier gain and typically, this will degrade the single-stage amplifier noise figure. In a two-stage design, the tilt compensation is distributed. Each stage produces part of the total gain tilt compensation. Hence, the two undesirable conditions of overload and increased noise figure due to AGC gain reduction can avoided.

Figure 3:
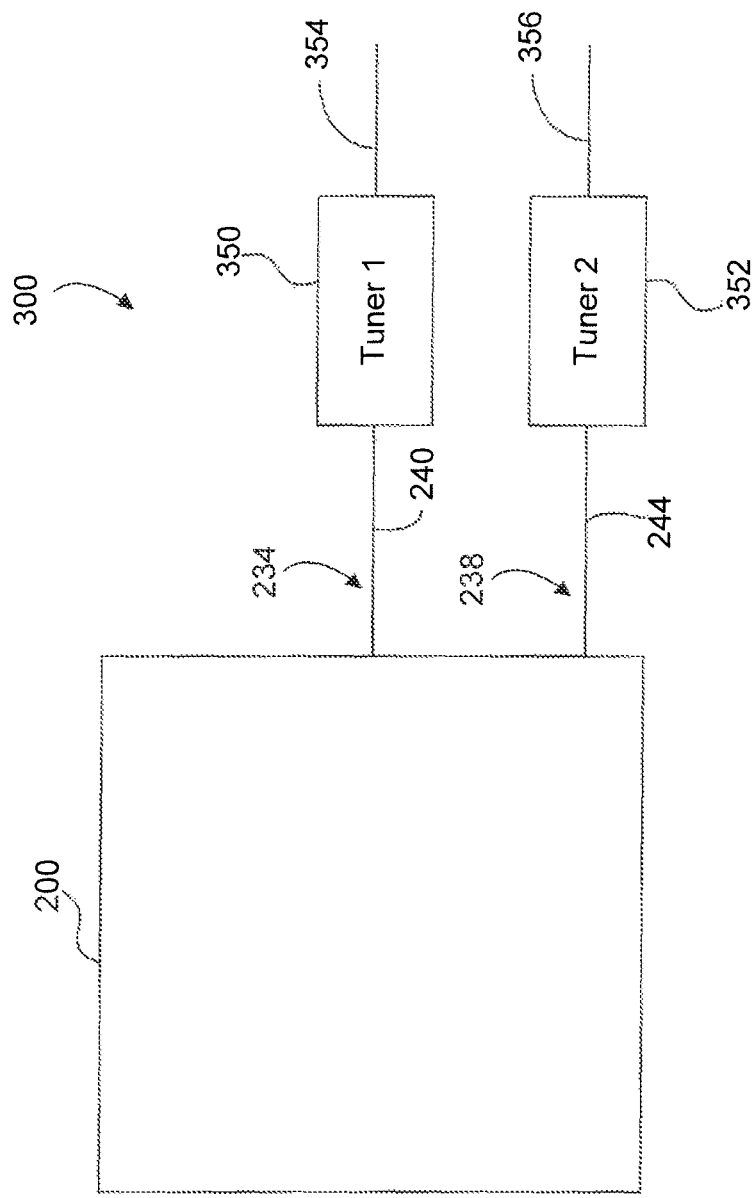
FIG. 3 shows a two-tuner arrangement coupled to the system of FIG. 2, according to an embodiment of the present invention.

FIG. 3 shows a two-tuner arrangement 300 coupled to system 200 of FIG. 2, according to an embodiment of the present invention. For example, arrangement 300 can include a first tuner Tuner 1 350 and a second tuner Tuner 2 352. In this example, Tuner 1 350 is coupled along path 234 and Tuner 2 352 is coupled along path 238. In one example, two tuners can be used in order to allow for more complex signal processing of a CATV or terrestrial signal, e.g., to allow for picture-in-picture or other functionality in a cable or set-top box. In this example, Tuner 1 350 can produce a signal 354 along path 234 and Tuner 2 352 can produce a signal 356 along path 238.

It is to be appreciated that, although two paths and tuners are shown, any number of paths and/or tuners can be used based on a desired application, and the system is not limited to two tuners.

In one example, as discussed above, when each of amplifiers 220, 222, and 224 in FIG. 2 (not shown in element 200 in FIG. 3) have automatic gain control, each tuner 350 and 352 can receive a constant input power.

In one example, Tuner 1 350 receives a low frequency channel and Tuner 2 352 receives a high frequency channel. In this arrangement, Tuner 1 350 would benefit from no negative tilt compensation being used, while Tuner 2 352 would benefit from the tilt being asserted on signal 244. In this example, by having tilt in the second stage, the first stage of the amplifier 200 can be used at a higher take-over point (input level), thus maximizing signal to noise ratio, while the high power interferers at low frequency can be removed by the second stage tilt. This can be considered independent tilt compensation both per amplifier stage and within the second amplifier stage.

Figure 4:
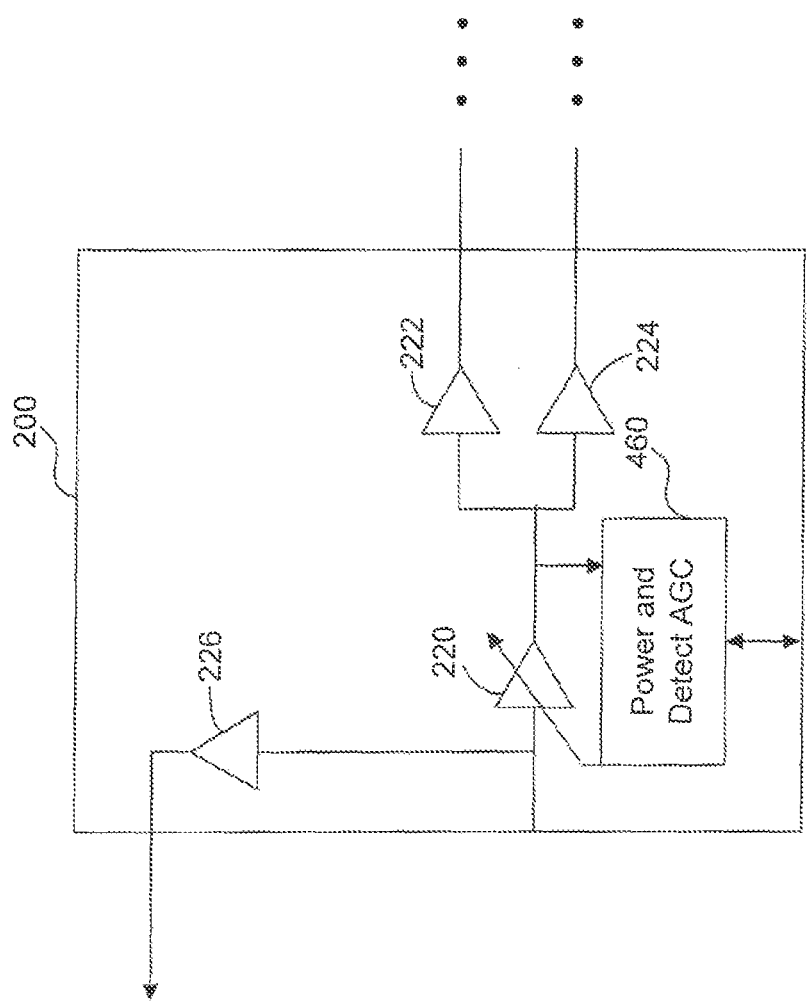
FIG. 4 shows a gain profile controller coupled to the system of FIG. 2, according to an embodiment of the present invention.

FIG. 4 shows a gain profile controller 460 coupled to system 200 of FIG. 2, according to an embodiment of the present invention. For example, although not shown, controller 460 can include a power detector and AGC loop driven by an output of the first amplifier stage. In one example, the AGC loop allows for gain control to protect amplifiers in system 200, and alternatively to also protect downstream devices, e.g., tuners, filters, set-top boxes, televisions, etc. In one example, since controller 460 works from total power at the output of 220, power occurring in each amplifier stage and at down stream devices is taken into account. In one example, controller 460 can duplicate the feedback and gain profile within system 200 and downstream.

An exemplary controller similar to controller 460 is taught in co-owned, co-pending U.S. Published Patent Application 2009/0261899, which is incorporated by reference herein in its entirety.

In one example, the automatic gain profile control is common to both paths 234 and 238. Also, a tilt replica in gain profile controller 460 can allow for accurate replication in the second stage gain allowing for a precise gain estimation for the down stream power management.

In one example, there is a need to amplify the input signal such that the resulting amplified signal has substantially uniform SNR and SDR across the entire operating frequency range. Further, since the input signal may vary over time, there is a need to adaptively shape the gain profile of the amplifier according to the input signal. At the same time, for best amplification performance, there is a need to accurately set and control the gain profile of an amplifier and to minimize gain profile variations due to temperature and/or process variations, for example. This can be accomplished through use of gain profile controller 460.

FIG. 5 shows an analog TV arrangement 500 coupled to system 200 of FIG. 2, according to an embodiment of the present invention. For example, arrangement 500 includes a television 572 coupled to loop through amplifier 226. In one example, LT amplifier 226 can be used to drive TV set 572 that does not have AGC. In another example, LT amplifier 226 can have fixed gain, low noise figure and high linearity to substantially eliminate degradation of the TV set 572. Low and fixed gain can substantially eliminate TV overload.

Figure 6:
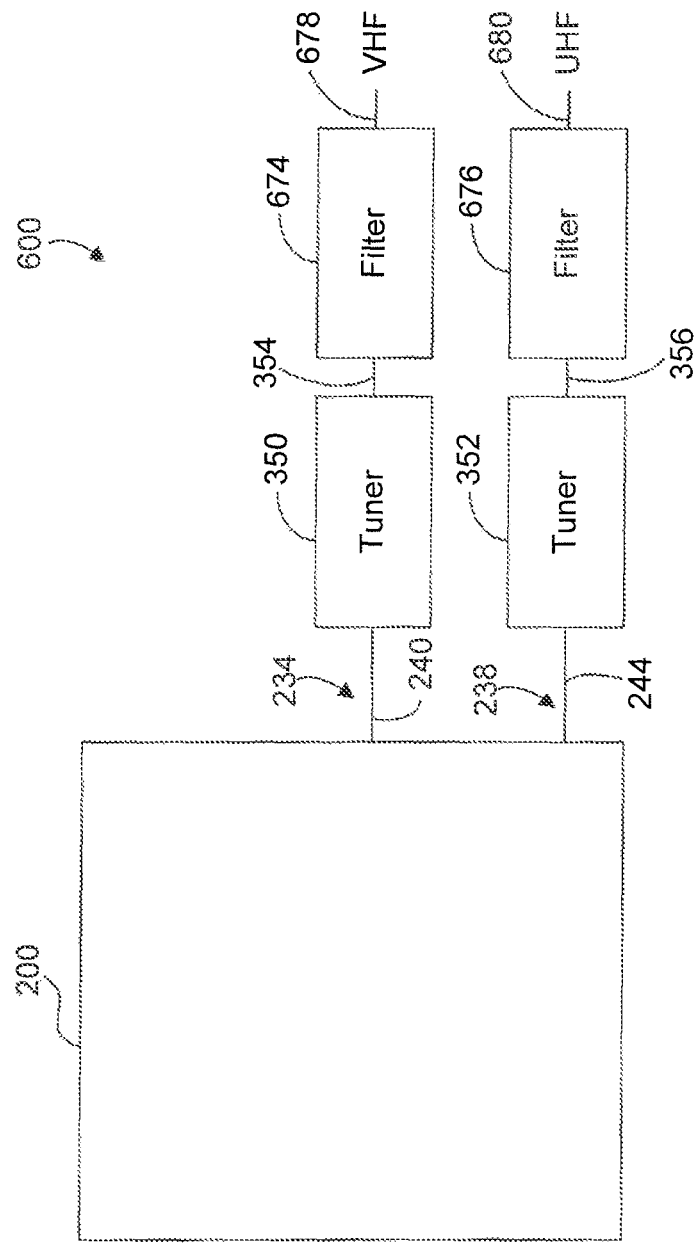
FIG. 6 shows a two-tuner, two-filter arrangement coupled to the system of FIG. 2, according to an embodiment of the present invention.

FIG. 6 shows a two-tuner, two-filter arrangement 600 coupled to system 200 of FIG. 2, according to an embodiment of the present invention. This embodiment can function similarly to arrangement 300 in FIG. 3. However, arrangement 600 further includes a first filter 674 that filters signal 354 along path 234 and a second filter 676 that filters signal 356 along path 238.

In one example, arrangement 600 can be considered a band-split arrangement.

In one example, first filter 674 can be any faun of filter based on an application, for example a high pass, low pass, or band pass filter, to produce a desired filter signal 678 along path 234. Similarly, second filter 676 can be any form of filter based on an application, for example a high pass, low pass, or band pass filter, to produce a desired filter signal 680 along path 238.

In one example, first filter 674 can be a low pass filter arranged to produce a VHF signal along path 234 and second filter 676 can be a band pass filter arranged to produce a UHF signal along path 238. For example, this arrangement can improve isolation between the two bands and can substantially reduce the tuner dynamic range.

Figure 7:
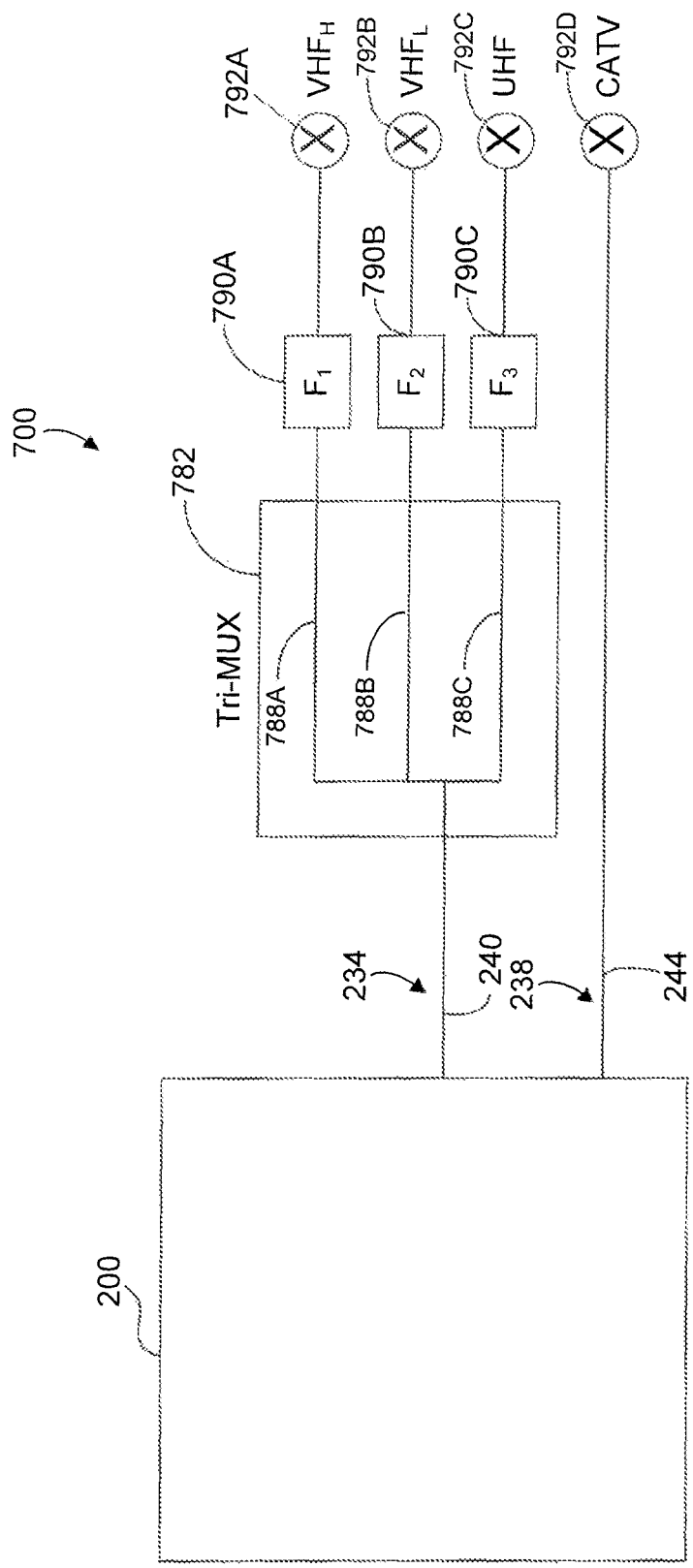
FIG. 7 shows a terrestrial television and cable television arrangement coupled to the system of FIG. 2, according to an embodiment of the present invention.

FIG. 7 shows a terrestrial television and cable television arrangement 700 coupled to system 200 of FIG. 2, according to an embodiment of the present invention. For example, system 700 can be used to process and produce both terrestrial and CATV signals using a same device 700. This may be considered a band-split arrangement. System 700 can include a tri-MUX or three channel multiplexer or splitter 782, a filter system 790, and a mixing system 792.

In one example, tri-MUX 782 can receive signal 240 along path 234 to produce three substantially identical signals or signal portions 788A, 788B, and 788C that can be associated with terrestrial TV. In this example, signal 788A is filtered by filter 790A and mixed by mixer 792A to produce a $VHF_H$ signal. Similarly, signal 788B is filtered by filter 790B and mixed by mixer 792B to produce a $VHF_L$ signal. Also similarly, signal 788C can be filtered by filter 790C and mixed by mixer 792C to produce a UHF signal. Splitting up the VHF and UHF signals can be done to substantially reduce interference between bands.

In this example, signal 236 along path 238 can be a CATV signal that is mixed by mixer 792D.

In this embodiment, depending on the input signal, one or the other of terrestrial path or CATV path may be activated at one time, for example using controller and switching system 900 discussed below with respect to FIG. 9.

In one example, a single tuner (not shown) can be used to process either the terrestrial TV signals or the CATV signals from any of the mixers 792 based on a switching control scheme or controller scheme that allows only one signal at a given time to reach the tuner. Alternatively, in another example, two or more tuners can be used. For example, one tuner per mixer 792 can be used, e.g., four tuners. In another example, one tuner can be used for each of the terrestrial signals and a tuner for CATV signals can be used. The above examples are meant to be exemplary, but not exhaustive combinations tuner configurations.

Figure 8:
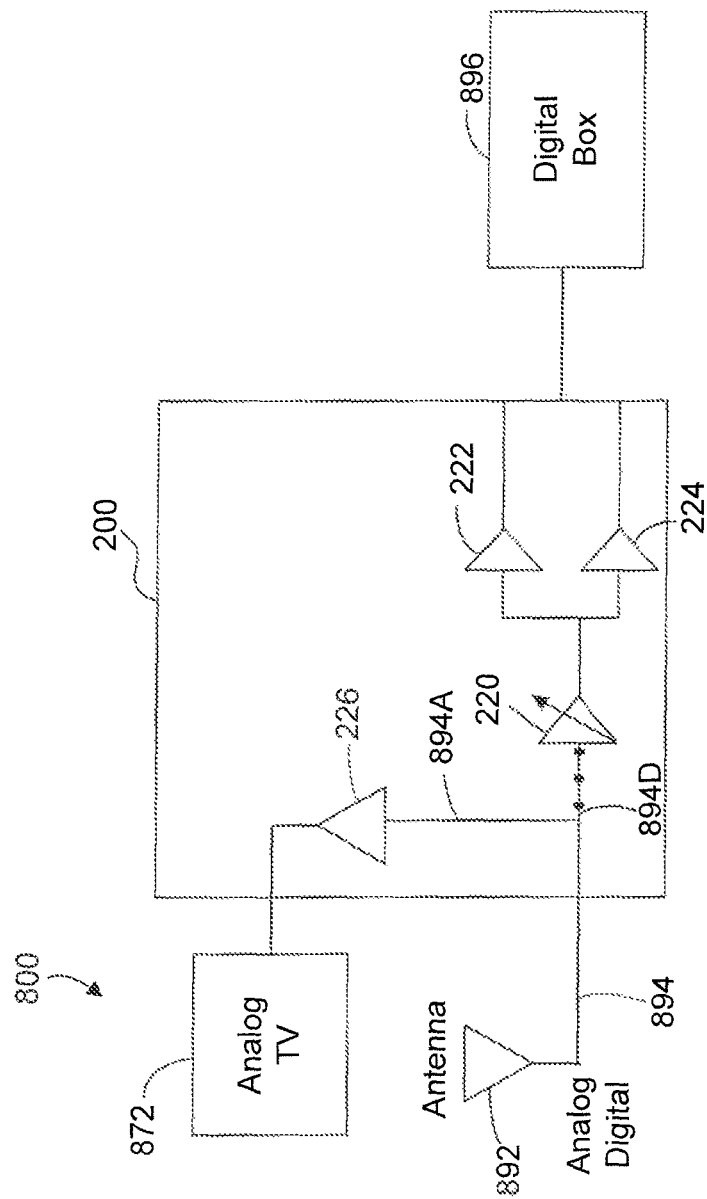
FIG. 8 shows an antenna, analog TV, and digital set-top box arrangement coupled to the system of FIG. 2, according to an embodiment of the present invention.

FIG. 8 shows an antenna, analog TV and digital set-top box arrangement 800 coupled to system 200 of FIG. 2, according to an embodiment of the present invention. This example is based on receiving a signal 894 using an antenna 892, e.g., a conventional, satellite, or cellular antenna, or the like, used to receive signals from a television network. In one example, antenna 892 can receive signal 894 that includes both an analog portion 894A and a digital portion 894D. In the example shown, analog portion 894A is processed through the loop through portion, e.g., amplified by the loop through amplifier 226, and is receive by television 872. Also, in this example, digital signal 894D is processed through first and second stage amplifiers 220, 222, and 224 and received by a digital box 896. For example, this can be the arrangement when an analog TV is being utilized, as well as a digital TV coupled to the digital set-top box 896.

Figure 9:
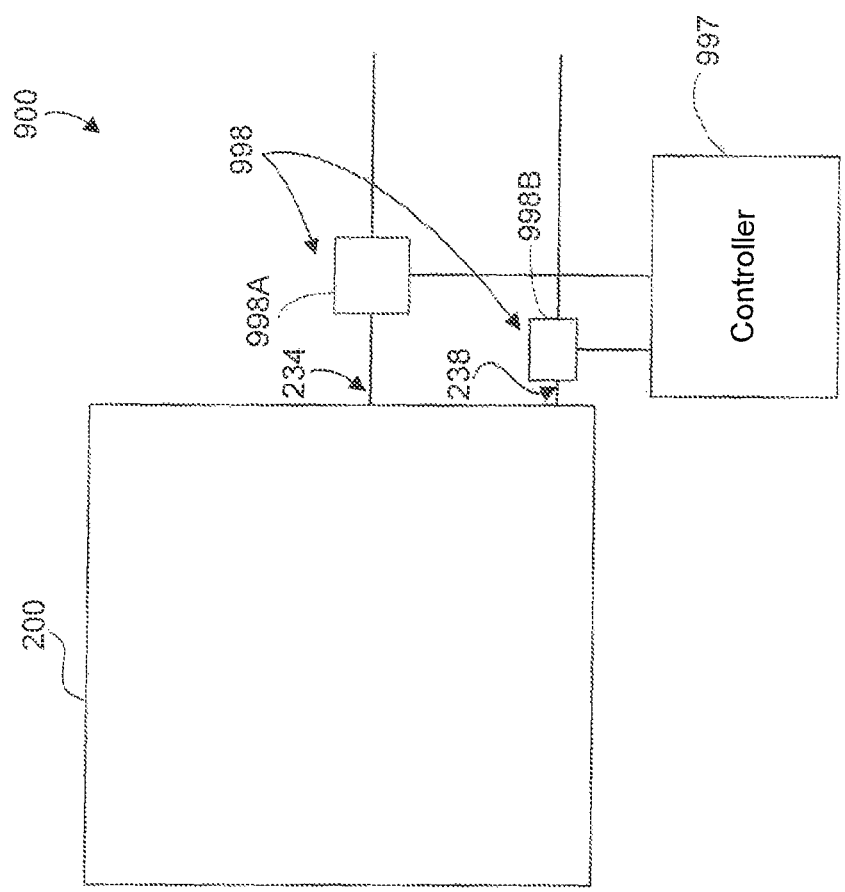
FIG. 9 shows a controller and switching system arrangement coupled to the system of FIG. 2, according to an embodiment of the present invention.

FIG. 9 shows a controller and switching system arrangement 900 coupled to system 200 of FIG. 2, according to an embodiment of the present invention. In one example, arrangement 900 includes a controller 997 and a switching system 998. Switching system includes a first switch 998A coupled to path 234 and a second switch 998B coupled to path 238. For example, switches 998A and 998B can be transistors. In one example, controller 997 can open and close one or both switches 998A and 998B in order to control whether signals can be transmitted along one, both or neither of paths 234 and/or 238. For example, this arrangement may be utilized for the embodiment shown in FIG. 7 above, such that only a terrestrial or CATV path is active at any one time. Other scenarios for wanting only one path to be active at a time would be application specific.

Embodiments of the present invention can be used in analog and/or digital amplifiers, including power amplifiers for audio, video, audio/video (A/V) (e.g. Cable Television (CATV) and Direct Broadcast Satellite (DBS) signals), and/or broadband RF signals.

Figure 10:
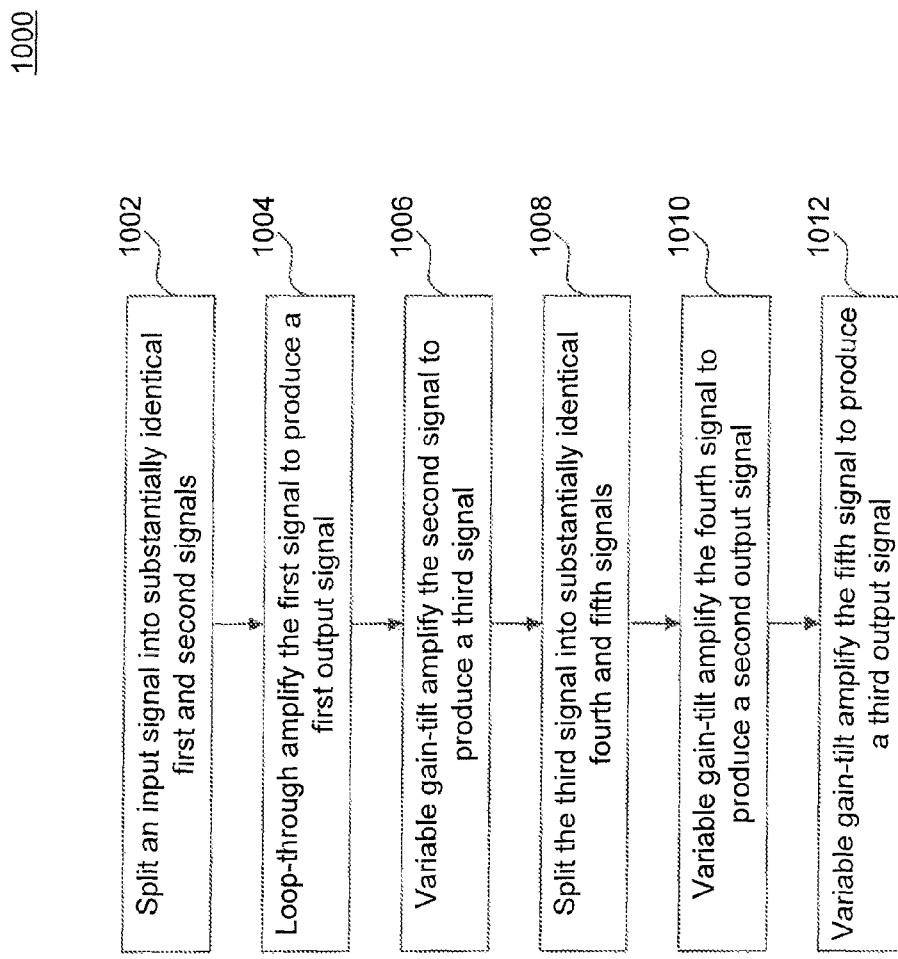
FIG. 10 shows a flowchart depicting a method, according to an embodiment of the present invention.

FIG. 10 shows a flowchart depicting a method 1000, according to an embodiment of the present invention. The method need not operate in the order of the steps shown. In one example, method 1000 can be implemented using one or more of systems 100-900 discussed above.

In step 1002, an input signal is split into substantially identical first and second signals. In step 1004, the first signal is loop-though amplified to produce a first output signal. In step 1006, the second signal is variable gain-tilt amplified to produce a third signal. In step 1008, the third signal is split into substantially identical fourth and fifth signals. In step 1010, the fourth signal is variable gain-tilt amplified to produce a second output signal. In step 1012, the fifth signal is variable gain-tilt amplified to produce a third output signal.

Figure 11:
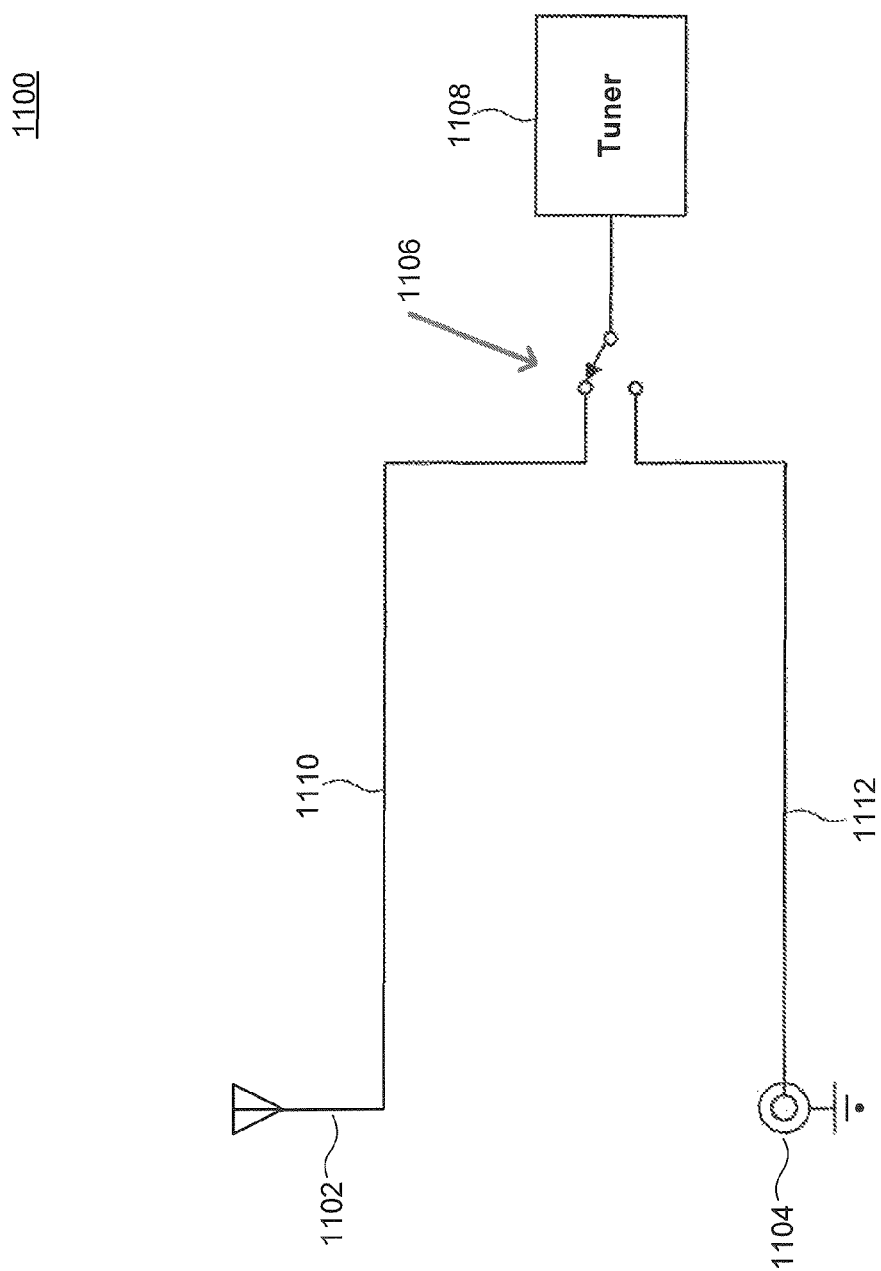
FIGS. 11 and 12 show various embodiments of a dual input set top box arrangement with simultaneous CATV and terrestrial reception.
Figure 12:
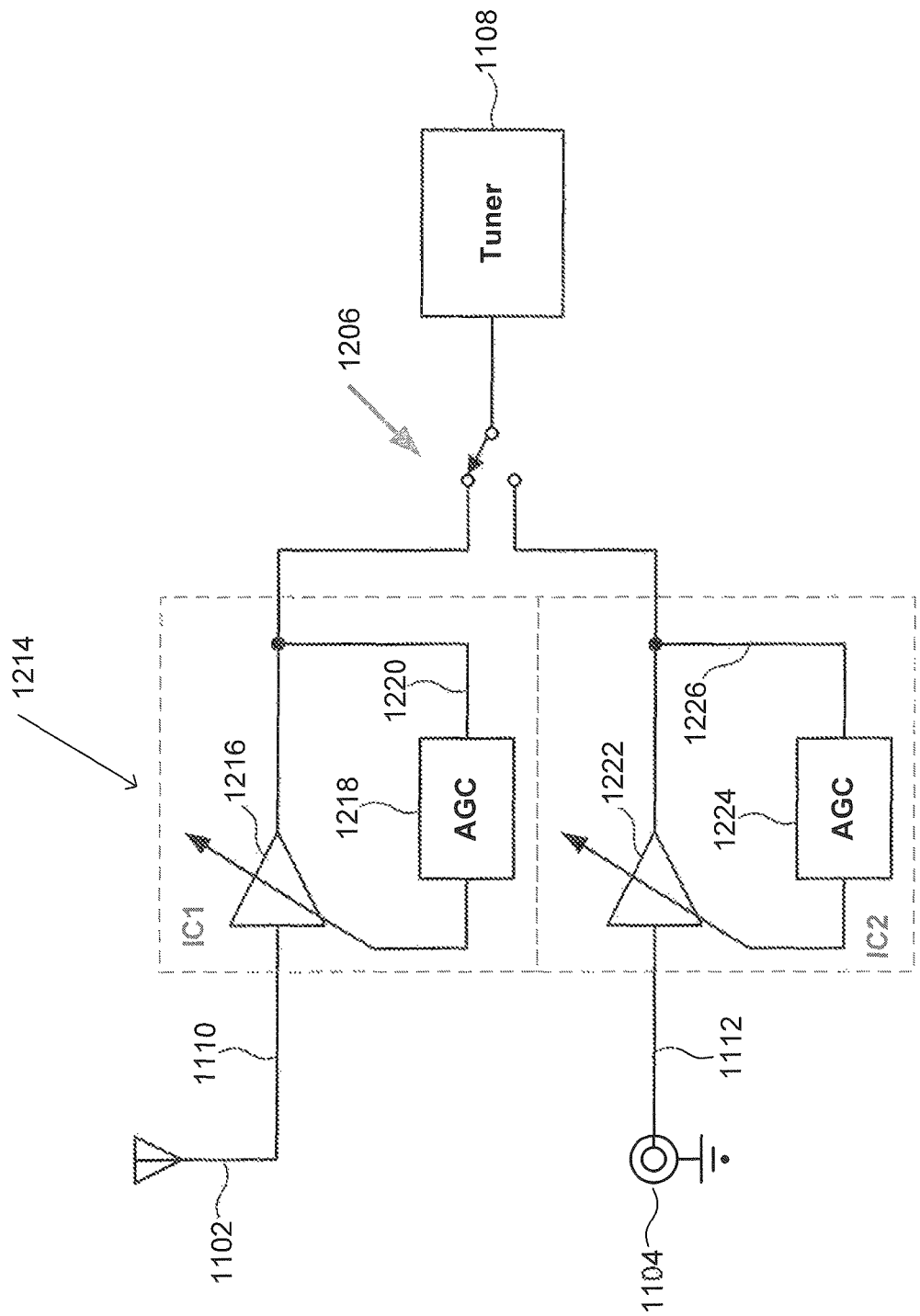

FIGS. 11 and 12 show various embodiments of a dual input set top box arrangement 1100 and 1200 with simultaneous CATV and terrestrial signal reception.

In the example shown in FIG. 11, arrangement 1100 includes a terrestrial signal antenna 1102, a cable signal receiver 1104, a switch 1106, and a tuner 1108. A terrestrial signal, e.g., a 0 dBm signal, travels from antenna 1102 along path 1110 and a cable signal, e.g., a −60 dBm signal, travels from receiver 1104 along path 1112 to switch 1106, e.g., a single pole double through switch. Switch 1106 drives tuner 1108, which can receive a signal from either path 1110 or 1112 depending on the position of switch 1106.

In one example, switch 1106 should exhibit 100 dB isolation to achieve a desired 40 dB signal-to-noise ratio and to keep the terrestrial signal from crossing into the cable signal, or vice versa, which isolation can produce a lot of signal loss and can degrade noise figure. For example, an array of cascaded switched may be used to produce the 100 dB isolation.

In the example shown in FIG. 12, arrangement 1200 is similar to arrangement 1100, except an amplifier system 1214 is located between antenna 1102/receiver 1104 and a switch 1206. In this example, amplifier system 1214 includes a first (terrestrial signal) amplifier section including a variable amplifier 1216 and an AGC device 1218 in a feedback path 1220 and a second (cable signal) amplifier section including a variable amplifier 1222 and an AGC device 1224 in a feedback path 1226. The first amplifier section is along path 1110 from antenna 1102, and the second amplifier section is along path 1112 from receiver 1104.

In this embodiment, through use of amplifier system 1214, isolation requirements of switch 1106 are decreased from 100 dB, as discussed in FIG. 11. This reduction can be obtained in a plurality of ways. For example, if the signal desired for reception is the CATV signal from connector 1104, amplifier 1216 can be turned off and will therefore exhibit very low gain (high isolation) for the signal from antenna 1102. If the signal from the CATV connector 1104 is weak, the amplifier 1222 will operate at maximum gain, boosting the signal at 1226. The isolation requirement of switch 1206 can be reduced from 100 dB to 100 dB minus the sum of the isolation of amplifier 1216 and the gain of amplifier 1222. For example, the isolation of amplifier 1216 in its off state might be 35 dB, and the gain of amplifier 1222 might be 25 dB. This would reduce the switch isolation requirement from 100 dB to 40 dB, a value that is easier to implement. A similar reduction in switch isolation requirement can be obtained if the desired signal is the terrestrial signal from antenna 1102 and the CATV amplifier 1222 is turned off. Furthermore, the losses of switch 1206 can have less effect on the system noise figure in this implementation as compared to that shown in FIG. 11, due to the gain of the preceding amplifiers.

It is to be appreciated that the Detailed Description section, and not the Abstract section, is intended to be used to interpret the claims. The Abstract section may set forth one or more, but not all, exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A system comprising:
a first amplifier stage having an input and an output, including a first gain-tilt amplifier having programmable tilt compensation;
a second amplifier stage coupled between the output of the first amplifier stage and a first output node, the second amplifier stage including a second gain-tilt amplifier having programmable tilt compensation, and a third gain-tilt amplifier having programmable tilt compensation;
a loop-through amplifier coupled between the input of the first amplifier stage and a second output node; and
a gain profile controller, coupled to the first, second, and third gain-tilt amplifiers, configured to independently control the tilt compensation of the first, second, and third tilt-gain amplifiers;
wherein the first tilt-gain amplifier is configured to apply a coarse tilt compensation and the second tilt-gain amplifier is configured to apply a fine tilt compensation.

2. The system of claim 1, wherein the first tilt-gain amplifier is configured apply a positive tilt compensation and the second tilt-gain amplifier is configured to apply a negative tilt compensation.

3. The system of claim 1, wherein the first tilt-gain amplifier is configured to apply a negative tilt compensation and the second tilt-gain amplifier is configured to apply a positive tilt compensation.

4. The system of claim 1, wherein the first, second, and third tilt-gain amplifiers are tilt-gain amplifiers with a plurality of positive and negative tilt compensation values.

5. The system of claim 1, wherein the gain profile controller is configured to control the tilt compensation of the first, second, and third tilt-gain amplifiers based on temperature variations.

6. The system of claim 1, wherein:
the first output node includes first and second output channels;
the first output channel outputs a first output signal from the second tilt-gain amplifier; and
the second output channel outputs a second output signal from the third tilt-gain amplifier.

7. The system of claim 6, further comprising:
a first tuner configured to receive the first output signal; and
a second tuner configured to receive the second output signal.

8. The system of claim 7, further comprising:
a first filter coupled to an output of the first tuner, whereby the first filter transmits VHF signals; and
a second filter coupled to an output of the second tuner, whereby the second filter transmits UHF signals.

9. The system of claim 6, further comprising:
a tri-multiplexer configured to receive the first output signal and to produce first through third signals therefrom; and
first through third filters configured to receive respective ones of the first through third signals,
whereby the first filter is configured to transmit $VHF_H$ signals,
whereby the second filter is configured to transmit $VHF_L$ signals, and
whereby the third filter is configured to transmit UHF signals.

10. The system of claim 9, wherein the second output channel is configured to transmit a cable TV signal.

11. The system of claim 6, further comprising:
a first switching device coupled to the first output channel and configured to start and stop signal transmission along the first output channel;
a second switching device coupled to the second output channel and configured to start and stop signal transmission along the second output channel; and
a controller coupled to the first and second switching devices and configured to open and close the first and second switching devices to perform the starting and stopping of the transmissions.

12. The system of claim 1, wherein the gain profile controller is configured to adaptively shape the tilt compensation of the first, second, and third tilt-gain amplifiers according to an input signal received at the first tilt-gain amplifier stage.

13. The system of claim 1, wherein the second output node is coupled to an analog television.

14. The system of claim 1, wherein the input of the first amplifier stage is coupled to an antenna.

15. A method comprising:
splitting an input signal into substantially identical first and second signals;
loop-though amplifying the first signal to produce a first output signal;
controlling the programmable tilt of a first tilt-gain amplifier;
coarse tilt amplifying the second signal with the first tilt-gain amplifier to produce a third signal;
splitting the third signal into substantially identical fourth and fifth signals;
controlling the programmable tilt of a second tilt-gain amplifier;
fine tilt amplifying the fourth signal with the second tilt amplifier to produce a second output signal;
controlling the programmable tilt of a third tilt amplifier; and
tilt amplifying the fifth signal with the third tilt amplifier to produce a third output signal.

16. The method of claim 15, further comprising:
tuning the second output signal to a first frequency; and
tuning the third output signal to a second frequency, whereby amplitudes of the first and second frequencies are orders of magnitude different.

17. The method of claim 16, further comprising:
filtering the tuned second output signal to produce VHF signals; and
filtering the tuned third output signal to produce UHF signals.

18. The method of claim 15, further comprising:
adaptively shaping the programmable tilt of the first, second, and third tilt amplifiers according to the input signal.

19. The method of claim 15, further comprising:
splitting the second output signal into substantially identical first, second and third portions;
filtering the first portion to produce $VHF_H$ signals;
filtering the second portion to produce $VHF_L$ signals;
filtering the third portion to produce UHF signals,
wherein the third output signal is a CATV signal.

20. An amplifier system comprising:
a first amplifier stage configured to coarse tilt amplify a plurality of frequency bands of a signal based on a corresponding first set of programmable gain values;
a second amplifier stage, coupled between the first amplifier stage and a first output, and configured to fine tilt amplify a plurality of frequency bands of a signal based on a corresponding second set of programmable gain values;
a gain profile controller, coupled to the first and second amplifier stages, configured to modify the first and second set of programmable gain values; and
a loop-through fixed-gain amplifier coupled between the first amplifier stage and a second output.

* * * * *

UNITED STATES PATENT AND TRADEMARK OFFICE
CERTIFICATE OF CORRECTION

| | | |
|---|---|---|
| PATENT NO. | : 8,725,097 B2 | Page 1 of 2 |
| APPLICATION NO. | : 12/847857 | |
| DATED | : May 13, 2014 | |
| INVENTOR(S) | : Gatta et al. | |

It is certified that error appears in the above-identified patent and that said Letters Patent is hereby corrected as shown below:

In the Claims

Column 10, line 53, claim 1, please replace "tilt-gain" with --gain-tilt--.

Column 10, line 54, claim 1, please replace "tilt-gain" with --gain-tilt--.

Column 10, line 55, claim 1, please replace "tilt-gain" with --gain-tilt--.

Column 10, line 57, claim 2, please replace "tilt-gain" with --gain-tilt--.

Column 10, line 58, claim 2, please insert --to-- between --configured-- and --apply--.

Column 10, line 59, claim 2, please replace "tilt-gain" with --gain-tilt--.

Column 10, line 61, claim 3, please replace "tilt-gain" with --gain-tilt--.

Column 10, line 63, claim 3, please replace "tilt-gain" with --gain-tilt--.

Column 10, line 66, claim 4, please replace "tilt-gain amplifiers are tilt-gain amplifiers" with --gain-tilt amplifiers are gain-tilt amplifiers--.

Column 11, line 3, claim 5, please replace "tilt-gain" with --gain-tilt--.

Column 11, line 9, claim 6, please replace "tilt-gain" with --gain-tilt--.

Column 11, line 11, claim 6, please replace "tilt-gain" with --gain-tilt--.

Column 11, line 23, claim 9, please delete "through" and insert --, second, and--.

Signed and Sealed this
Seventh Day of October, 2014

Michelle K. Lee
*Deputy Director of the United States Patent and Trademark Office*

CERTIFICATE OF CORRECTION (continued)
U.S. Pat. No. 8,725,097 B2

Column 11, line 25, claim 9, please delete "through" and insert --, second, and--.

Column 11, line 48, claim 12, please replace "tilt-gain" with --gain-tilt--.

Column 11, line 49, claim 12, please replace "tilt-gain" with --gain-tilt--.

Column 12, line 6, claim 15, please replace "tilt-gain" with --gain-tilt--.

Column 12, lines 8-9, claim 15, please replace "tilt-gain" with --gain-tilt--.

Column 12, line 12, claim 15, please replace "tilt-gain" with --gain-tilt--.

Column 12, line 14, claim 15, please replace "tilt" with --gain-tilt--.

Column 12, line 16, claim 15, please replace "tilt" with --gain-tilt--.

Column 12, line 18, claim 15, please replace "tilt" with --gain-tilt--.

Column 12, line 32, claim 18, please replace "tilt" with --gain-tilt--.